US012808043B2

(12) United States Patent
Hidaka et al.

(10) Patent No.: US 12,808,043 B2
(45) Date of Patent: Nov. 24, 2026

(54) VAPORIZATION SUPPLY METHOD AND VAPORIZATION SUPPLY DEVICE

(71) Applicant: FUJIKIN INCORPORATED, Osaka (JP)

(72) Inventors: Atsushi Hidaka, Osaka (JP); Kazuyuki Morisaki, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 1200 days.

(21) Appl. No.: 17/757,283

(22) PCT Filed: Nov. 9, 2020

(86) PCT No.: PCT/JP2020/041693
§ 371 (c)(1),
(2) Date: Jun. 13, 2022

(87) PCT Pub. No.: WO2021/124723
PCT Pub. Date: Jun. 24, 2021

(65) Prior Publication Data
US 2023/0002900 A1 Jan. 5, 2023

(30) Foreign Application Priority Data
Dec. 16, 2019 (JP) ................................ 2019-226789

(51) Int. Cl.
*C23C 16/448* (2006.01)
*C23C 16/02* (2006.01)
(Continued)

(52) U.S. Cl.
CPC ........ *C23C 16/448* (2013.01); *C23C 16/0209* (2013.01); *C23C 16/18* (2013.01); *C23C 16/45557* (2013.01)

(58) Field of Classification Search
CPC ............................ C23C 16/52; C23C 16/4481
See application file for complete search history.

(56) References Cited

U.S. PATENT DOCUMENTS 5,632,797 A * 5/1997 Williams ................ B01D 3/06 261/DIG. 65
6,179,277 B1 * 1/2001 Huston ................ C23C 16/448 261/157
(Continued)

FOREIGN PATENT DOCUMENTS

JP 2009-252760 A 10/2009
JP 2010-180429 A 8/2010
(Continued)

OTHER PUBLICATIONS

International Search Report issued in PCT/JP2020/041693; mailed Jan. 19, 2021.

*Primary Examiner* — Ibrahime A Abraham
*Assistant Examiner* — Lawrence H Samuels
(74) *Attorney, Agent, or Firm* — Studebaker Brackett PLLC

(57) ABSTRACT

A vaporization supply device includes a vaporizer for heating and vaporizing a liquid raw material L, a flow rate controller for controlling a flow rate of the gas supplied from the vaporizer to a gas supply destination, and a controller for heating the inside of the vaporizer to obtain a necessary gas flow rate, and performing a feedback control so that a pressure becomes equal to or higher than a predetermined value. The controller is configured so as to stop the feedback control at the time point when the flow rate control by the flow rate controller starts, then heat the liquid raw material by an amount of heat provided to the vaporizer more than the heat that has already been provided immediately before the feedback control ends, and change to the feedback control
(Continued)

after a predetermined time has elapsed from the time point when the flow rate control by the flow rate controller starts.

10 Claims, 6 Drawing Sheets

(51) Int. Cl.
*C23C 16/18* (2006.01)
*C23C 16/455* (2006.01)
*C23C 16/52* (2006.01)

(56) References Cited

U.S. PATENT DOCUMENTS 8,931,506 B2 * 1/2015 Nagata .................. F02D 19/023 137/341
9,994,955 B2 * 6/2018 Hidaka ..................... F17C 9/02
2005/0249874 A1 * 11/2005 Hoshino ............. C23C 16/4485 118/726
2011/0100483 A1 * 5/2011 Nagata .................. F02D 19/027 137/334
2012/0028445 A1 * 2/2012 Suzuki .................. C23C 16/325 257/E21.09
2013/0084059 A1 * 4/2013 Ohmi .................. C23C 16/4483 392/389
2014/0356796 A1 * 12/2014 Terasaka ............. C23C 16/4485 432/13
2015/0275367 A1 * 10/2015 Moroi ................. C23C 16/4481 427/255.28
2015/0322567 A1 * 11/2015 Hidaka ............... C23C 16/4481 392/400
2016/0047047 A1 * 2/2016 Moroi ................. C23C 16/4481 118/712
2018/0071702 A1 * 3/2018 Hidaka .................... B01J 4/008
2019/0136370 A1 * 5/2019 Taguchi ................ C23C 14/246
2020/0255944 A1 * 8/2020 Shimizu .................. C23C 16/52
2021/0197157 A1 * 7/2021 Miyamoto ........... G05D 7/0635

FOREIGN PATENT DOCUMENTS

JP 2013-077710 A 4/2013
JP 2014-114463 A 6/2014

* cited by examiner

Prior Art

VAPORIZATION SUPPLY METHOD AND VAPORIZATION SUPPLY DEVICE

TECHNICAL FIELD

The present invention relates to a method and a device for vaporizing and supplying a liquid raw material (also referred to as a liquid material) using a vaporizer that is used in semiconductor manufacturing equipment, a chemical industry facility, a pharmaceutical industry facility, or the like.

BACKGROUND OF INVENTION

Conventionally, a liquid raw material vaporization supply device for supplying a raw material fluid has been used in semiconductor manufacturing equipment using a Metal Organic Chemical Vapor Deposition method (MOCVD) (for example, Patent Documents 1 to 4).

For example, as shown in FIG. 6, in this type of vaporization supply device 1, a liquid raw material L such as TEOS (Tetraethyl orthosilicate) is stored in a storage tank T, a pressurized inert gas FG is supplied to the storage tank T, by pressurizing the inert gas FG, the liquid raw material L in the storage tank T is pushed out at a constant pressure and supplied to a vaporizer 2, the vaporizer 2 is healed by a heater 3 such as a jacket heater to a predetermined temperature to vaporize the liquid raw material L, the vaporized gas G is controlled to a predetermined flow rate by a flow rate controller 4, and supplied to semiconductor manufacturing equipment 6. In FIG. 6, a reference numeral 7 denotes a stop valve, and a reference numeral 8 denotes a vacuum pump.

In a temperature control unit 9, a detected temperature of a temperature sensor 10 incorporated in the vaporizer 2 is compared with a set temperature, and feedback control to the heater 3 is performed so that the deviation of the two temperatures decreases.

In order to replenish the reduction of the liquid raw material L in the vaporizer 2 due to vaporization of the liquid raw material L in the vaporizer 2 and supply to the semiconductor manufacturing equipment 6, it is necessary to detect the reduction of the liquid raw material L and to replenish the reduced amount of the liquid raw material L into the vaporizer 2.

In order to detect and replenish the reduction of the liquid raw material in the vaporizer 2, a first control valve 11 for controlling the supply of the liquid raw material to the vaporizer 2 is provided in a supply path 12 to the vaporizer 2, and a pressure detector 13 for detecting the pressure of the gas vaporized in the vaporizer 2 is provided. The liquid raw material L in the vaporizer 2 is heated and vaporized, and the vaporized gas continues to be discharged from the vaporizer 2, thereby the liquid raw material L decreases, and when the amount of the vaporized liquid material L decreases, the pressure also drops. A liquid supply control unit 14 receives data of the gas pressure inside the vaporizer 2 detected by the pressure detector 13, when the detected pressure of the pressure detector 13 drops to the threshold value, closes the first control valve 11 after opening it for a predetermined time and supplies a predetermined amount of liquid raw material in the vaporizer 2. When the liquid raw material L in the vaporizer 2 is heated, vaporized, discharged, and decreased again, the detected pressure of the pressure detector 13 drops to the threshold value, the liquid supply device 14 again closes the first control valve 11 after opening it for a predetermined time, and the control was performed by repeating the sequence.

PRIOR-ART DOCUMENT

Patent Literature

Patent Document 1: Japanese Laid-Open Patent Publication No. 2009-252760

Patent Document 2: Japanese Laid-Open Patent Publication No. 2010-180429

Patent Document 3: Japanese Laid-Open Patent Publication No. 2013-77710

Patent Document 4: Japanese Laid-Open Patent Publication No. 2014-114463

SUMMARY OF INVENTION

Problems to be Solved by Invention

In the idling state before the flow rate control of the gas in the vaporizer and supply to the supply destination starts, the temperature in the vaporizer is feedback controlled to become a set temperature, so that the vaporized gas in the vaporizer is in a saturated state at the set temperature, thereby the pressure in the vaporizer is maintained at a substantially constant pressure above the threshold value. However, immediately after starting the supply of gas from the vaporizer to the semiconductor manufacturing equipment through the flow rate controller, the pressure in the vaporizer rapidly drops.

When the pressure in the vaporizer drops rapidly, the pressure in the vaporizer falls sharply below the saturated vapor pressure at the set temperature, thereby vaporization of the liquid material in the vaporizer is rapidly advanced, the liquid material in the vaporizer is deprived of the vaporization heat and the temperature of the liquid material falls sharply below the set temperature. A temperature sensor in the vaporizer detects this temperature drop and the temperature control unit feedback controls the supply power to the heater so as to raise the temperature of the liquid material in the vaporizer to the set temperature. As a result, the temperature inside the vaporizer rises, the liquid raw material is vaporized as the temperature rises, and the pressure inside the vaporizer rises.

In the control flow rate conventionally generally used, even if the heater is feedback controlled at the time point when the pressure in the vaporizer drops below the saturated vapor pressure, since the evaporation amount of the liquid raw material can be sufficiently secured, the pressure in the vaporizer do not drops below the threshold value immediately after the gas supply starts.

However, when the flow rate of the gas supplied from the vaporizer becomes a flow rate exceeding a certain level (hereinafter referred to as a "large flow rate"), if the temperature rises due to the feedback control after the gas supply starts, the evaporation amount of the gas generated by the vaporization by heating the heater does not catch up, the pressure in the vaporizer does not rise enough, and the pressure in the vaporizer falls below the threshold value immediately after the gas supply starts, the pressure drop is detected by the pressure detector, and the phenomenon may occur that the liquid supply control unit supplies the liquid material into the vaporizer even though enough liquid material still remains in the vaporizer.

Further, when the flow rate of the supplied gas is the large flow rate, it is necessary to vaporize a large amount of liquid raw material, which requires a large amount of electric power to be supplied to the heater. When the gas supply from the vaporizer ends in such a state, the heater is still in a high temperature state, which is able to vaporize a large amount of liquid raw material until then, thus even after the gas supply ends, the temperature in the vaporizer is raised by the heat remaining in the heater.

Conventionally, since the necessary evaporation amount of the gas is not so much, so the power supplied to the heater for the evaporation amount is also not so high, the heat remitting in the heater at the time point when the gas supply ends is used to vaporize the liquid raw material before the temperature in the vaporizer rises, therefore the problem of exceed temperature rising in the vaporizer after the gas supply ends did not occur.

However, when the large flow rate of gas is supplied, since a large amount of the evaporation of gas is required, the power supplied to the heater is increased. Thus, a considerable amount of heat is supplied to the inside of the vaporizer even when the gas supply ends. Therefore, the amount of heat remaining in the heater not only vaporizes the liquid raw material, but also increases the temperature in the vaporizer, and as a result, the temperature in the vaporizer may also rise over the assumed upper limit temperature and cause overshoot.

Therefore, a main object of the present invention is to provide a vaporization supply method and a vaporization supply device capable of preventing overshoot of the temperature of the vaporizer at the time point when the gas supply ends and preventing excessive supply of the liquid material to the vaporizer at the time point when the gas supply starts.

Means for Solving Problem

In order to achieve the above object, a first aspect of the present invention is a vaporization supply method of a vaporizer for heating and vaporizing a liquid raw material inside the vaporizer, controlling a flow rate of a vaporized gas and suppling to a supply destination. By using the vaporizer, the inside of the vaporizer is heated to obtain a necessary gas flow rate, and feedback control is performed so that a pressure becomes equal to or higher than a predetermined value. The vaporization supply method includes a step of stopping the feedback control at a time point when the flow rate control of the vaporized gas starts, and heating the liquid raw material in the vaporizer by providing a heat amount more than a heat amount that has already been provided immediately before stopping the feedback control, thereby increasing the evaporation amount of the vaporized gas more than that when the feedback control is performed, and a step of changing the amount of heart provided to the vaporizer to the amount of heat provided by the feedback control, after a predetermined time has elapsed from the time when the flow rate control of the vaporized gas starts.

A second aspect of the present invention, according to the first aspect, further includes a step of stopping to heat the liquid raw material a predetermined time at the time point when the gas supply from the vaporizer ends, thereby vaporizing the liquid raw material in the vaporizer by the amount of heat that has already been provided to the vaporizer until the time point when the gas supply from the vaporizer ends.

A third aspect of the present invention is a vaporization supply method of a vaporizer for heating and vaporizing a liquid raw material in a vaporizer, controlling a flow rate of a vaporized gas and suppling to a supply destination. By using the vaporizer, the inside of the vaporizer is heated to obtain a necessary gas flow rate, and the feedback control is performed so that a pressure becomes equal to or higher than a predetermined value. The method includes a step of stopping to heat the liquid raw material a predetermined time before the time point when the gas supply from the vaporizer ends, and vaporizing the liquid raw material in the vaporizer by the amount of heat that has already been provided to the vaporizer until the time point when the gas supply from the vaporizer ends.

In a fourth aspect of the present invention, the gas in the vaporizer is flow rate controlled by a pressure type flow rate controller and supplied to the supply destination in any one of the first to the third aspects.

Further, a fifth aspect of the present invention further includes a step of preheating the liquid raw material to be vaporized in the vaporizer in any one of the first to the fourth aspects.

In a sixth aspect of the present invention, a heater for heating the liquid raw material is controlled at a duty ratio of 100% until a predetermined time has elapsed from the time when the flow rate control of the vaporized gas starts.

A seventh aspect of the present invention is a vaporization supply device including: a vaporizer for heating and vaporizing a liquid raw material, a flow rate controller for controlling a flow rate of a gas supplied from the vaporizer to a gas supply destination and a controller for heating the inside of the vaporizer to obtain a necessary gas flow rate and performing feedback control so that a pressure becomes equal to or higher than a predetermined value, wherein the controller is configured so as to stop the feedback control at the time point when the flow rate control by the flow rate controller starts, heat the liquid raw material by providing an amount of heat to the vaporizer more than the amount of heat that has already been provided immediately before the feedback control ends, and change to the feedback control after a predetermined time has elapsed from the time point when the flow rate control by the flow rate controller starts.

In an eighth aspect of the present invention, according to the seventh aspect, the controller is configured so as to stop heating the vaporizer a predetermined time before the time point when the gas supply from the vaporizer ends, thereby vaporize the liquid in the vaporizer by the amount of heat that has already been provided to the vaporizer until the time point when the gas supply from the vaporizer ends.

A ninth aspect of the present invention is a vaporization supply device including: a vaporizer for heating and vaporizing a liquid raw material, a flow rate controller for controlling a flow rate of a gas supplied from the vaporizer to a gas supply destination, and a controller for heating the inside of the vaporizer to obtain a necessary gas flow rate, and performing feedback control so that a pressure becomes equal to or higher than a predetermined value, wherein the controller is configured to stop heating the vaporizer a predetermined time before the time point when the gas supply from the vaporizer ends, thereby vaporize the liquid in the vaporizer by the amount of heat that has already been provided to the vaporizer until the time point when the gas supply from the vaporizer ends.

In a tenth aspect of the present invention, according to any one of the seventh to the ninth aspects, the flow rate controller is a pressure type flow rate controller.

Additionally, in an eleventh aspect of the present invention, according to any one of the seventh to the tenth aspects, a preheater for preheating the liquid raw material to be supplied to the vaporizer is connected to the vaporizer.

Moreover, in the twelfth aspect of the present invention, according to the seventh aspect, the controller controls the heater for heating the liquid raw material at a duty ratio of 100% until a predetermined time has elapsed from the time point when the flow rate control by the flow rate controller starts.

Effect of Invention

According to the vaporization supply method and the vaporization supply device of the present invention, excessive supply of the liquid material to the vaporizer at the time of starting the gas supply can be prevented, and the temperature overshoot of the vaporizer at the time of ending the gas supply can also be prevented, by increasing the amount of heat for heating until a predetermined time has elapsed from the time when the flow rate control of the gas starts, and stopping the heat a predetermined time before the time when the gas supply ends.

DETAILED DESCRIPTION OF EMBODIMENT

Figure 1:
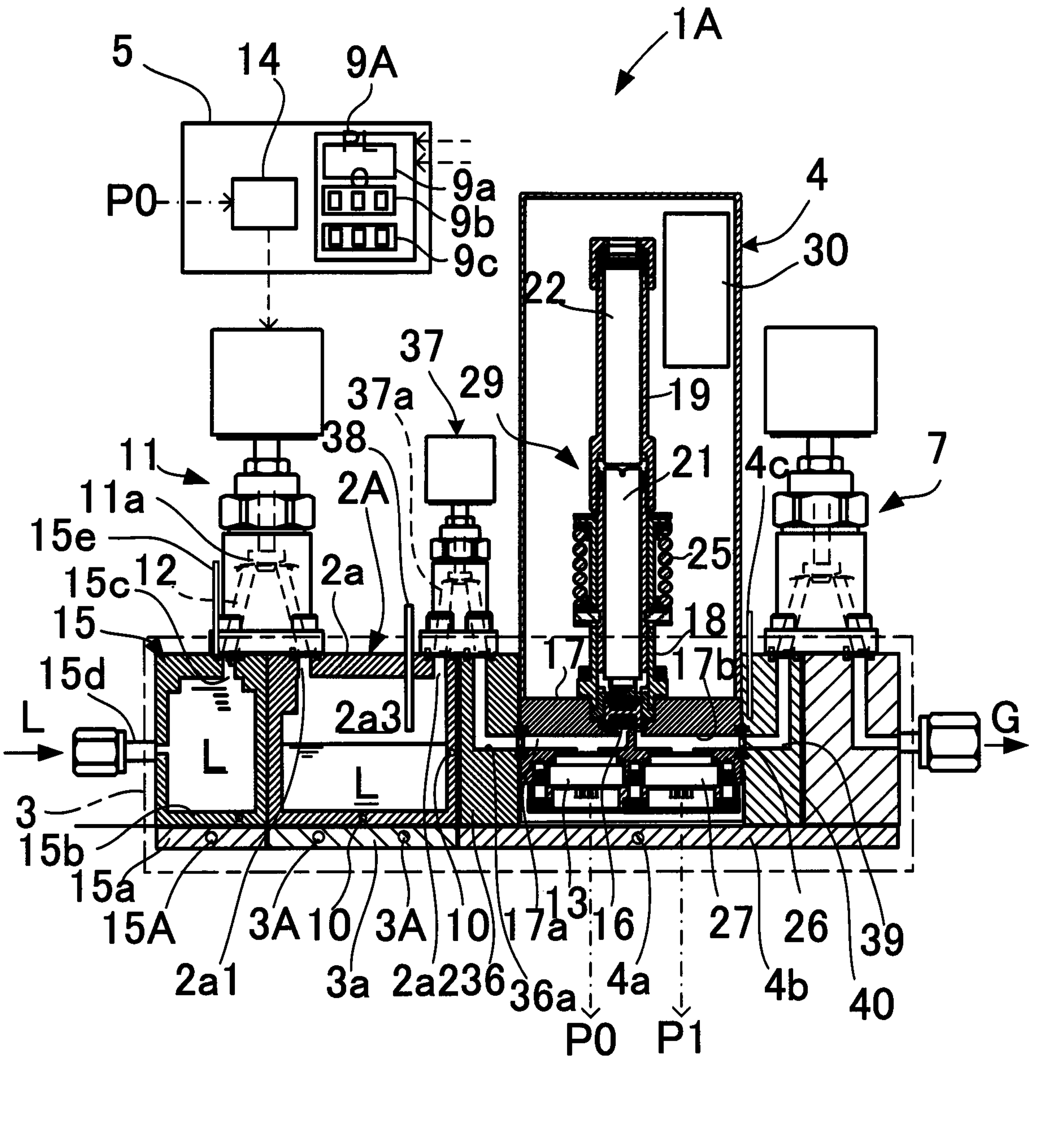
FIG. 1 is a partial longitudinal sectional front view showing an embodiment of a vaporizer supply device according to the present invention.

Embodiments of the vaporization supply device according to the present invention will be described below with reference to the drawings. The same or similar composing elements, including conventional arts, are denoted by the same reference numerals.

FIG. 1 shows an embodiment of the vaporization supply device according to the present invention. As shown in FIG. 1, the vaporization supply device 1A includes a vaporizer 2A for heating and vaporizing a liquid raw material L by a heater 3A, a flow rate controller 4 for controlling the flow rate of a gas G delivered from the vaporizer 2A, and a controller 5 for controlling the supply and temperature of the liquid raw material L.

The vaporizer 2A includes a temperature sensor 10 for detecting the temperature of the vaporizer 2A. The controller 5 includes a temperature control unit 9A for controlling the heater 3A based on the output of the temperature sensor 10.

The vaporization supply device 1A includes a pressure detector 13. The pressure detector 13 detects the pressure of the gas G vaporized by the vaporizer 2A and sent to the flow rate controller 4. A first control valve 11 is interposed in a path 12 for supplying the liquid raw material L to the vaporizer 2A. The controller 5 includes a liquid supply control unit 14. The liquid supply control unit 14 controls the first control valve 11 based on the detected output P0 of the pressure detector 13.

The vaporizer 2A is provided with a main body 2*a* formed of stainless steel or the like. In the main body 2*a*, a liquid supply port 2*a*1 and a gas discharge port 2*a*2 are formed in the upper part, and a vaporization chamber 2*a*3 is formed inside.

A cartridge heater is employed as the heater 3A for heating the liquid in the vaporizer 2A, and the cartridge heater is embedded in a heat transfer material 3*a* such as an aluminum plate respectively fixed to the bottom surface and the side surface of the main body 2*a* (only the bottom is shown in the drawing).

The cartridge heater may be installed only on the bottom surface, combined with a heat transfer material such as an aluminum plate on the side surface, it is also possible to heat the whole device with a small heat source by transferring heat of the heater on the bottom surface to the side surface.

A preheater 15 is connected to the vaporizer 2A for receiving and heating the liquid raw material L. The preheater 15 also includes a heater 15A same as in the vaporizer 2A. The heater 15A can be a cartridge heater and is embedded in at least any one of the heat transfer materials of the heal transfer material 15*a* such as an aluminum plate fixed to the bottom surface, and the left and right sides of the preheater 15 (only the bottom surface is shown). In the preheater 15, a liquid inflow port 15*d* is connected to the side surface, a liquid storage chamber 15*b* communicating with the liquid inflow port 5*d* is formed inside, and a liquid outflow port 15*c* communicating with the liquid storage chamber 15*b* is formed on the upper surface. The preheater 15 stores the liquid raw material L, that has been pumped and sent at a predetermined pressure from an unillustrated liquid storage tank (see reference numeral T in FIG. 6), in the liquid storage chamber 15*b* and preheats the liquid material L by the heater 15A.

The flow rate controller 4 coupled to the vaporizer 2A is also provided with a heater 4*a* same as the vaporizer 2A. The gas flowing through the flow rate controller 4 is heated by the heater 4*a*. The heater 4*a* is also embedded in at least any one of the heat transfer materials of the heat transfer material 4*h* such as an aluminum plate fixed to the bottom and side surfaces of the flow rate controller 4. In addition, the heater 4*a* can also heat the gas flowing through a stop valve 7 installed downstream of the flow control device 4*a*.

the heaters 15A, 3A, and 4*a* for heating the preheater 15, the vaporizer 2A, and the flow rate controller 4 can be controlled to different heating temperatures respectively. For example, in the illustrated embodiment, the heater 15A of the preheater 15 is controlled to 180° C., the heater 3A of the vaporizer 2A is controlled to 202° C., and the heater 4*a* of the flow rate controller is controlled to 210° C. respectively. The vaporization supply device 1A can also be covered on its outer side with a thermal insulating jacket 3.

The first control valve 11 is fixed so as to straddle the upper surface of the main body 2*a* of the vaporizer 2A and the upper surface of the preheater 15. By opening and closing the supply path 12 communicated with the liquid outlet 15*c* of the preheater 15 and the liquid supply port 2*a*1 of the main body 2*a*, the first control valve 11 controls the supply amount of the liquid raw material L to the vaporizer 2A. As the first control valve 11 of the illustrated embodiment, an air drive valve for controlling the opening and closing of the valve element 11*a* by utilizing air pressure is used.

Figure 2:
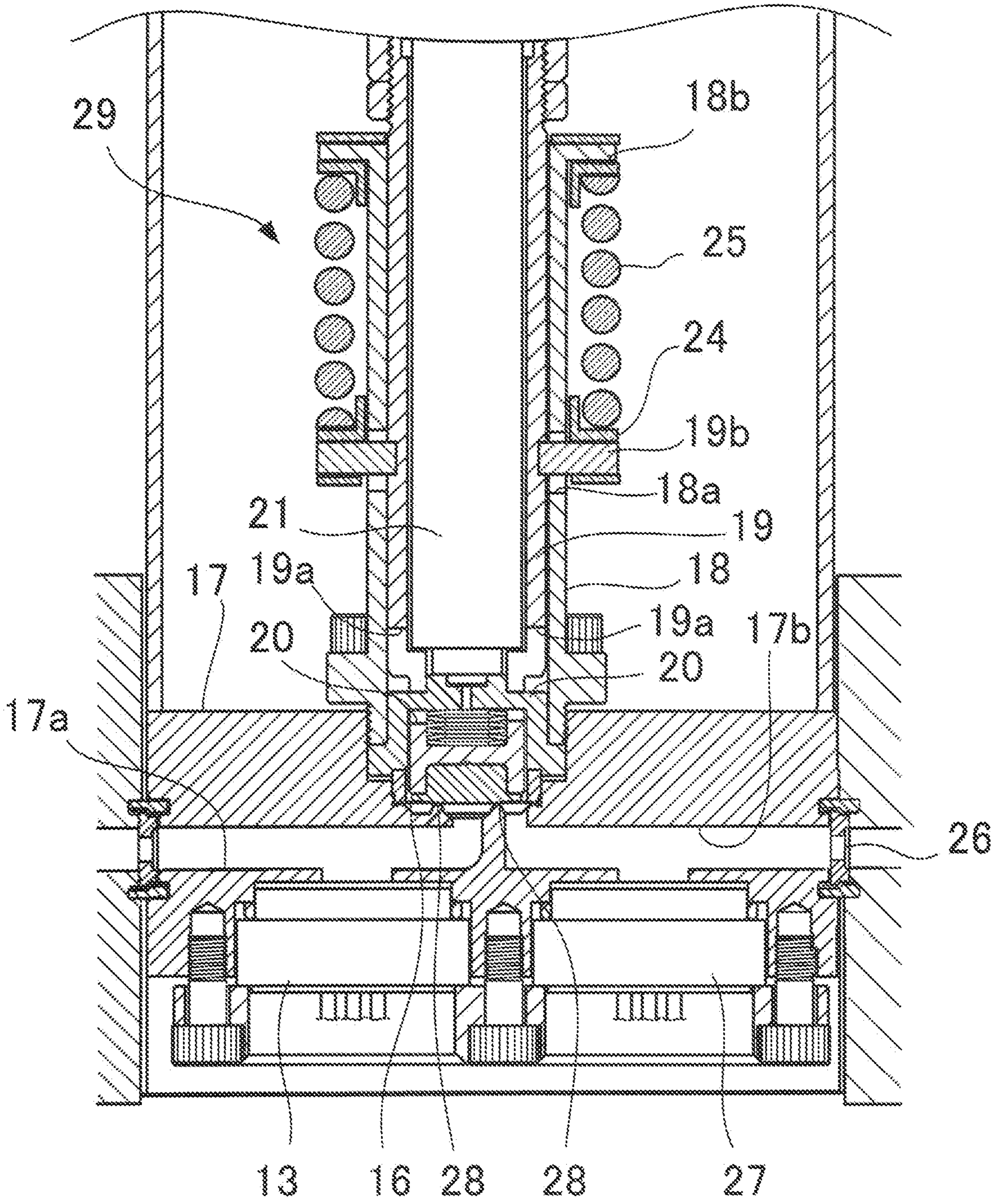
FIG. 2 is a partial enlarged view of FIG. 1.

The flow rate controller 4 of the illustrated example is a known flow rate controller called a pressure type flow rate controller of high temperature compatible type. Referring to FIGS. 1 and 2, the flow rate controller 4 includes a valve block 17, a gas flow path 17*a*~17*b* formed in the valve block 17, a metal diaphragm valve element 16 interposed between the gas flow path 17*a* and the gas flow path 17*b*, a cylindrical guide member 18 erectly fixed to the valve block 17, a valve stem case 19 slidably inserted into the cylindrical guide member 18, a bridge 20 penetrating holes 19*a*, 19*a* formed in the lower portion of the valve stem case 19 and being pressed and fixed by the cylindrical guide member 18, a heat dissipating spacer 21 and a piezoelectric driven element 22 supported by the bridge 20 while being accommodated in the valve stem case 19, a flange receiver 19*h* protruding on the outer periphery of the stem case 19 and extending through a hole 18*a* formed in the cylindrical guide member 18, a flange body 24 mounted on the flange receiver 19*b*, a flange portion 18*b* formed on the upper end portion of the cylindrical guide member 18, a coil spring 25 arranged in a compressed state between the flange portion 18*b* and the flange body 24, a perforated thin plate 26 provided with micropores and interposed in the gas flow path 17*b* downstream of the metal diaphragm valve element 16, and a flow rate control pressure detector 27 for detecting the pressure in the gas flow path 17*b* between the metal diaphragm valve element 16 and the perforated thin plate 26. The heat dissipating spacer 21 is formed of an invar material or the like to prevent the piezoelectric driven element 22 from becoming a heat-resistant temperature or higher even if a high-temperature gas flows in the gas flow path 17*a* and 17*b*.

During de-energization of the piezoelectric driven element 22, the valve stem case 19 is pushed downward in the figure by the coil spring 25, as shown in FIG. 2, the metal diaphragm valve element 16 abuts the valve seat 28 and closes the space between the gas flow path 17*a* and the gas flow path 17*b*. The piezoelectric driven element 22 is extended by energizing the piezoelectric driven element 22, when the valve stem case 19 is lifted upward in the figure against the elastic force of the coil spring 25, the metal diaphragm valve element 16 is returned to the original reverse dish shape by self-elastic force, and the space between the gas flow path 17*a* and the gas flow path 17*b* is opened. In this manner, a piezoelectric driven control valve 29 is configured for opening and closing the metal diaphragm valve element 16 by driving the piezoelectric driven element 22.

The flow rate controller 4 detects the gas pressure of at least upstream of the perforated thin plate 26 by the flow rate control pressure detector 27 and controls the flow rate by opening and closing the metal diaphragm valve element 16 interposed in the gas flow path 17*a*-17*b* by the piezoelectric driven element 22 based on the detected pressure signal. When the absolute pressure of the upstream of the perforated thin plate 26 is about twice or more of the absolute pressure of the downstream of the perforated thin plate 26 (critical expansion condition), the gas passing through the micropore of the perforated thin plate 26 becomes the sound velocity, since the flow rate does not exceed the sound velocity, the flow rate depends on only the upstream pressure of the micropore of the perforated thin plate 26, the principle that the flow rate passing through the micropore of the perforated thin plate 26 is proportional to the upstream pressure of the perforated thin plate 26 is utilized. Although not shown, the downstream pressure of the micropore of the perforated thin plate 26 may also be detected, and the flow rate control may be performed based on the differential pressure between the upstream side and downstream side of the micropore. The perforated thin plate 26 is an orifice plate in which an orifice is formed in the illustrated example, but the micropore of the perforated thin plate 26 is not limited to the orifice and may be any structure that squeezes fluid (for example, a some nozzle or the like).

Figure 3:
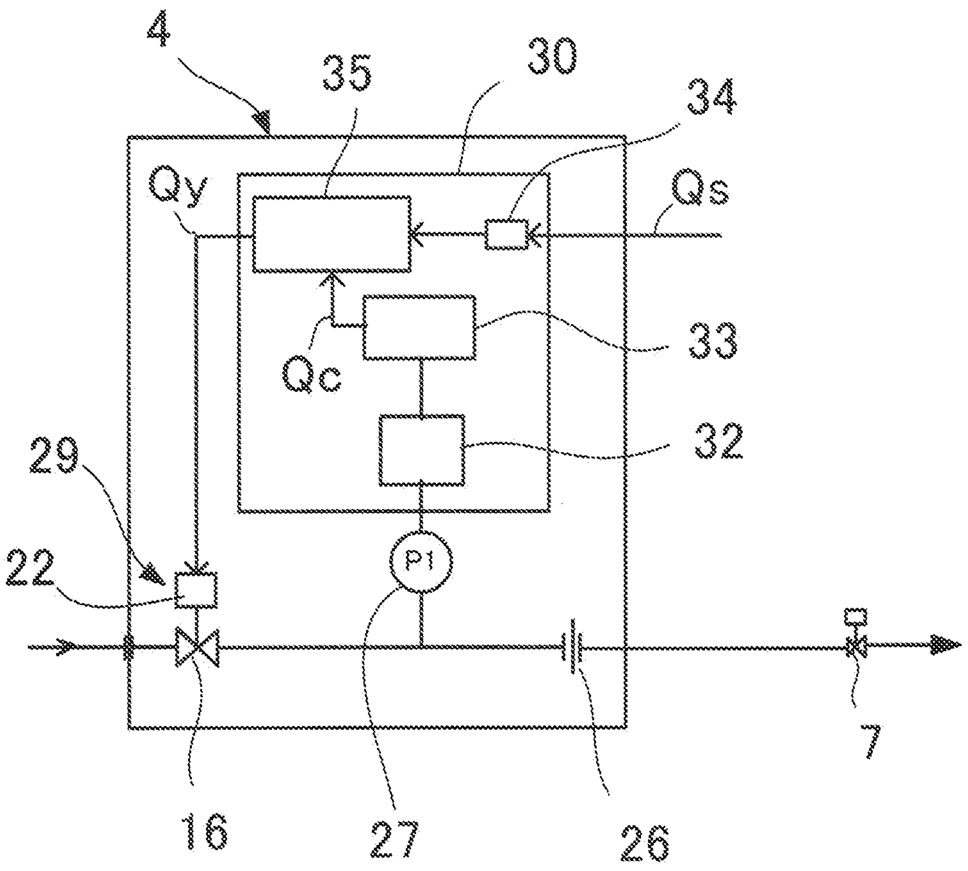
FIG. 3 is a control block diagram of a flow rate controller that is a composing element of the vaporization supply device according to the present invention.
Figure 6:
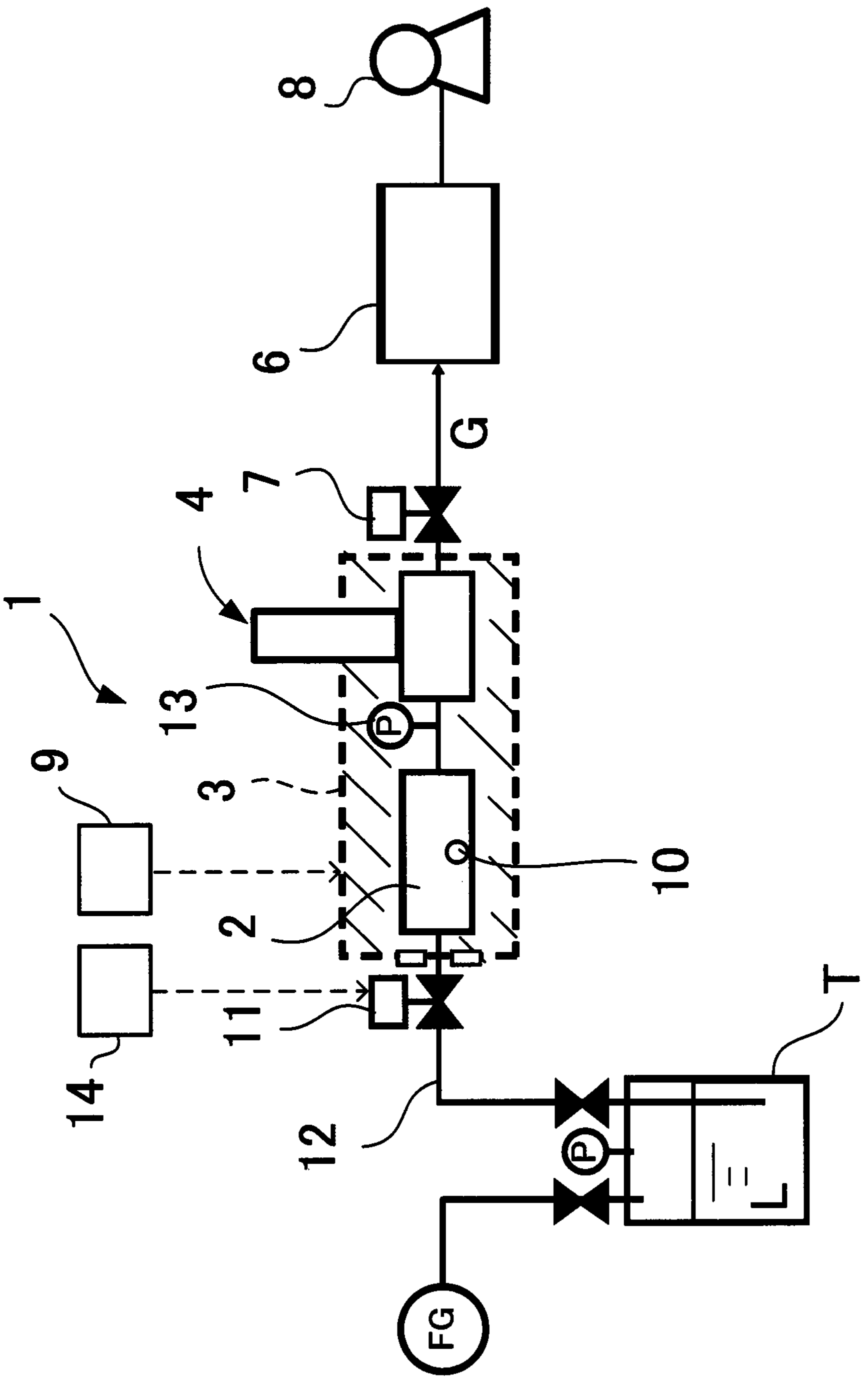
FIG. 6 is a schematic configuration diagram showing an example of semiconductor manufacturing equipment including a conventional vaporization supply device.

The FIG. 3 is a control block diagram of the flow rate controller 4. In FIG. 3, a reference numeral 29 is the piezoelectric driven control valve, a reference numeral 26 is the perforated thin plate (orifice plate), a reference numeral 30 is an arithmetic control unit, the detected value of the flow rate control pressure detector 27 is input to a flow rate arithmetic unit 33 through an amplification-AD converter 32, the gas flow rate flowing through the perforated thin plate 26 is calculated as $Qc=KP1$ (P1 is the detected pressure of the flow control pressure detector 27). Thereafter, the set flow rate value Qs from a setting input unit 34 and the calculated flow rate value Qc are compared by a comparison unit 35, and the difference signal Qy between the two is input to the piezoelectric driven element 22 of the piezoelectric driven control valve 29, whereby the metallic diaphragm valve 16 of the piezoelectric driven control valve 29 is opened and closed in the direction where the difference signal Qy becomes zero. The setting input unit 34 receives an external input signal, and the flow rate controller 4 controls the gas flow rate. The external input signal input to the setting input unit 34 includes not only the set flow rate value Qs, but also signals such as a control start command, gas supply time, etc. These external input signals are sent from, for example, a control computer (not shown) on the side of semiconductor manufacturing equipment 6 (FIG. 6).

Referring to the FIG. 1, the spacer block 36 is connected to the main body 2*a*, and a valve block 17 is connected to the spacer block 36. The gas flow path 37*a* in the second control valve 37 fixed so as to straddle the main body 2*a* and the spacer block 36 communicates the vaporization chamber 2*a*3 of the main body block 2*a* and the gas flow path 36*a* of the spacer block 36. When the liquid supply is stopped, or when the liquid level is detected exceeding the specified liquid level by a liquid level detector 38 for detecting the liquid level in the vaporization chamber 2*a*3, the liquid can be surely prevented from flowing to the flow rate controller 4 by closing the second control valve 37. The gas flow path 36*a* of the spacer block 36 communicates with the gas flow path 17*a* of the valve block 17.

The pressure detector 13 is provided in the gas flow path 17*a* (upstream of the metal diaphragm valve element 16) of the valve block 17, the pressure of the gas vaporized in the vaporizer 2A and sent to the flow rate controller 4 is detected by the pressure detector 13.

The signals (P0) of the pressure value detected by the pressure detector 13 is always sent to the liquid supply control unit 14 and is monitored. When the liquid raw material L in the vaporization chamber 2*a*3 decreases due to vaporization, the pressure inside of the vaporizer 2A decreases. When the liquid raw material L in the vaporization chamber 2*a*3 decreases, the pressure inside of the vaporization chamber 2*a*3 decreases, and the detected pressure of the pressure detector 13 reaches a preset value (threshold value: for example 140 kPa·abs), the liquid supply control unit 14 supplies a predetermined amount of the liquid raw material L to the vaporization chamber 2*a*3 by outputting a control signal to close the first control valve 11 after opening it for a first predetermined time. When a predetermined amount of the liquid raw material L is supplied into the vaporization chamber 2*a*3, the evaporation amount of the gas in the vaporization chamber 2*a*3 increases by vaporization of the liquid raw material L and the gas pressure rises again, thereafter, the evaporation amount of the gas decreases due to the decreasing of the liquid raw material L, and the pressure inside of the vaporization chamber 2*a*3 decreases again. When the pressure inside of the vaporization chamber 2*a*3 reaches the set value (threshold), the first control valve 11 is closed again after opening it for the first predetermined time. The liquid supply control unit 14 of the controller 5 executes such a control sequence, thereby a predetermined amount of liquid raw material is successively replenished in the vaporization chamber 2*a*3.

A stop valve 7 provided in the gas flow path 39 downstream of the flow rate controller 4 is used to reliably stop the gas supply at the time of stopping the gas supply.

A temperature sensor 10 is embedded in the main body 2*a* of the vaporizer 2A. The temperature sensor 10 may be a known sensor such as a platinum resistance temperature detector, a thermocouple, a thermistor, or an infrared thermometer. Although the temperature sensor 10 for detecting the temperature of the vaporizer 2A is embedded in the main body 2*a*2 of the vaporizer 2A in the present embodiment, it may be disposed in the inner space of the vaporizer 2A (inside the vaporization chamber 2*a*3), or it may be disposed by sticking to the outer surface of the main body 2*a* of the vaporizer 2A. In the present invention, "the temperature sensor for detecting the temperature of the vaporizer" includes a temperature sensor embedded in the vaporizer main body, a temperature sensor disposed inside the vaporizer (vaporization chamber), and a temperature sensor installed on the outer surface of the vaporizer main body.

The temperature control unit 9A of the controller 5 may include a programmable logic controller 9*a*, a temperature controller 9*b* for receiving a digital input from the programmable logic controller 9*a*, and a switching element 9*c* for turning on and off by receiving a control output from the temperature controller 9*b*. As the switching element 9*c*, a semiconductor switching element having excellent high-speed response such as SSR (solid-state relay) may be used. The switching element is connected to the heater 3A to turn on and off the current flowing through the heater 3A.

The temperature control unit 9A of the controller 5 feedback controls the heater 3A so that the detected value of the temperature sensor 10 becomes the set temperature. More specifically, upon receiving a control signal from the programmable logic controller 9*a*, the temperature controller 9*b* outputs a feedback control signal to the switching element 9*c*. Since the feedback control (PID control) is performed using the switching element 9*c*, a known time division proportional operation control is utilized. The control period in the time division proportional operation is, for example, about 1 millisecond. The programmable logic controller 9*a* of the temperature control unit 9A is communicatively connected to the arithmetic control unit 30 (FIG. 3) of the flow rate controller 4 by a DeviceNet or EtherCAT (registered trademark) to receive a signal such as the flow control start command, gas supply time, etc.

By feedback-controlling the temperature control unit 9A of the controller 5 so that the heater 3A becomes a set temperature, the gas pressure in the vaporizer 2A becomes equal to or higher than a predetermined value (threshold value) to obtain a necessary gas flow rate. The threshold of the gas pressure in the vaporizer 2A is also appropriately set to, for example, 140 kPa or more, in accordance with the semiconductor manufacturing equipment 6 (FIG. 6), to which the vaporization supply device 1A is connected. The necessary gas flow rate is appropriately set to for example, 20 g/min, in accordance with the semiconductor manufacturing equipment 6 (FIG. 6), to which the vaporization supply device 1A is connected.

In the same manner as described above, the temperature control unit 9A of the controller 5 can respectively control the heater 15A and the heater 4*a*, so that the detected values from the temperature sensor 15*e* provided in the preheater 15 and the temperature sensor 4*c* provided in the vicinity of the perforated thin plate 26 of the flow rate controller 4 become the set temperatures. In the illustrated example, although the temperature sensor 4*c* is embedded in the downstream side flow path block 40 connected to the downstream side of the valve block 17, it can also be embedded in the valve block 17.

Figure 4:
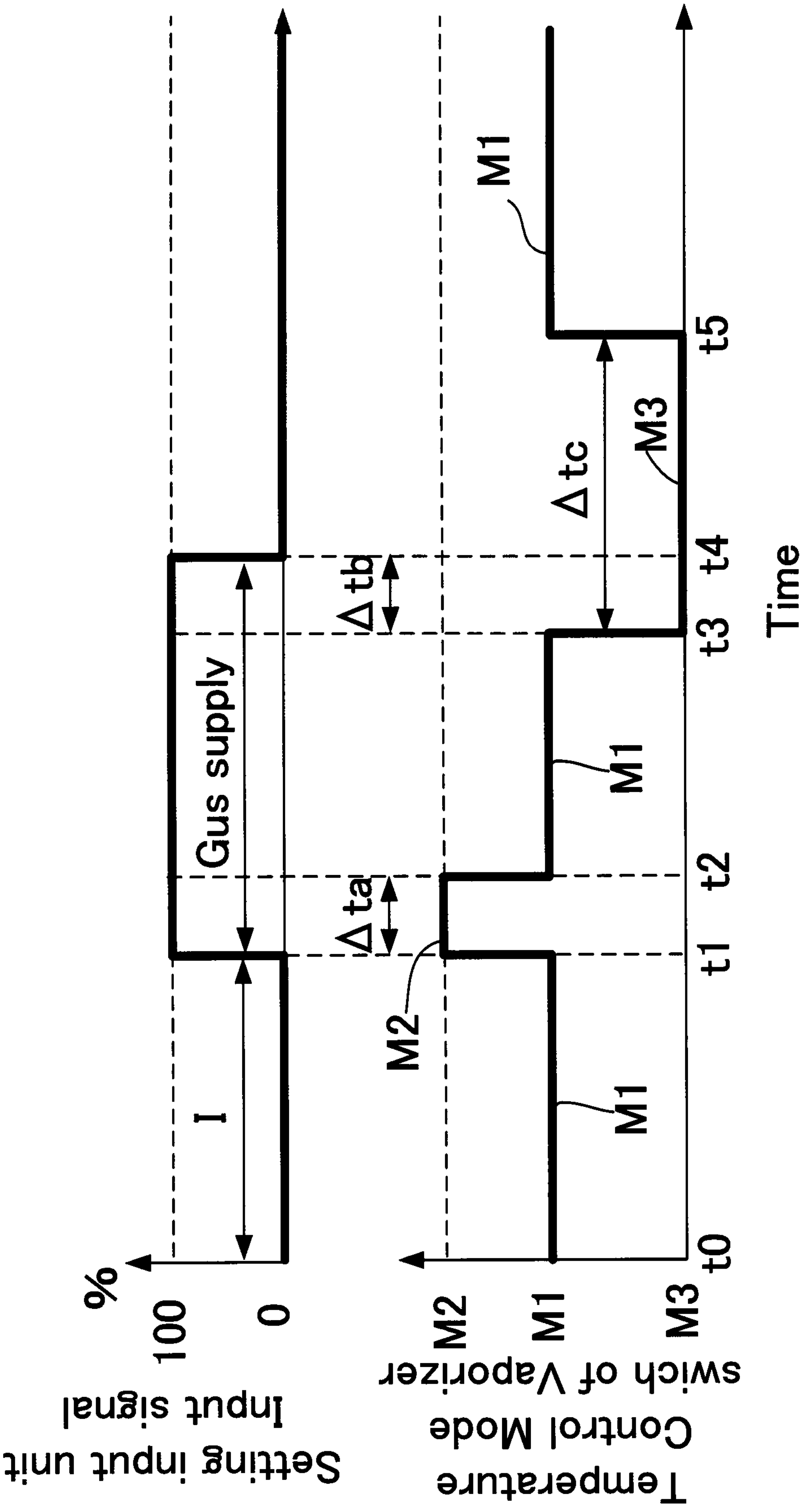
FIG. 4 is an example of a control timing chart of the vaporization supply device according to the present invention.

The FIG. 4 shows an example of a timing chart indicating the timing of the flow rate control by the flow rate controller 4 (the upper chart in FIG. 4) and a timing chart indicating the switch timing of the temperature control mode of the vaporizer 2A by the temperature control unit 9A (the lower chart in FIG. 4).

Referring to the FIG. 4, the flow rate controller 4 starts supplying the vaporized gas at time t1 after an idling time I has passed and stops gas supplying at time t4. The flow rate of the gas to be supplied may be any flow rate, in the example of FIG. 4, the flow rate controller 4 controls the flow rate at full scale (100%). The idling time I from the time t0 to t1 is a standby time until the flow rate control starts, and the inside of the vaporizer is kept in a saturated state at a high temperature and a high pressure (for example, 205° C., 219 kPa·abs), wherein the vaporized gas and the liquid raw material coexist. The temperature control unit 9A controls the idling time I by a first control mode M1 of the PID control.

The temperature control unit 9A controls the switching element 9*c* in a second control mode M2 of the duty ratio 100%, during the period from the flow rate control start time t1 until the time t2 after a second predetermined time Δta (60 seconds in the example of FIG. 4) has elapsed. As a result, the liquid raw material L is heated by providing the vaporizer 2A an amount of heat larger than the amount of heat that has already been given to the vaporizer 2A immediately before the first control mode M1 (feedback control) ends. Consequently, in the second control mode M2, the evaporation amount of the gas G to be vaporized in the vaporizer 2A increases than that in the first control mode (feedback control).

The temperature control unit 9A performs the PID control in the first control mode M1 from time t2 until time t3, which is a third predetermined time Δtb before stop time t4 (60 seconds before in the example of FIG. 4), and controls the switching element 9*c* in a third control mode M3 of the duty ratio 0% from time t3 until time t5, which is the time after a fourth predetermined time Δtc (Δtc>Δtb, in the example of FIG. 4 Δtc=5 minutes) has elapsed, and stops heating the liquid raw material L. Thus, the liquid raw material in the vaporizer 2A is vaporized by the amount of heat that has already been provided to the vaporizer 2A by the time of stopping the heat until the time point when the gas supply from the vaporizer 2A ends. That is, even if stopping the power supply to the heater 3A, by the amount of the retention heat in the main body 2*a* of the vaporizer 2A and the heat transfer material 3*a* that has been heated up to time t3, it is possible to vaporize the necessary amount of liquid raw material from time t3 to time t4.

After time t5, the temperature control unit 9A returns to the PID control of the first control mode M1. The duty ratio of the first control mode M1 is, for example, 20 to 80%.

As shown in FIG. 4, the temperature control unit 9A switches the control mode between the PID control of the first control mode (feedback control), the second control mode of the duty ratio 100%, and the third control mode of the duty ratio 0%.

In the embodiment of FIG. 4, the duty ratio of the second control mode M2 is 100%, but in other embodiments, the duty ratio of the second control mode M2 may be a constant value of 90% to 100%.

The present invention will be described more specifically with reference to Example and Comparative Example. However, the present invention is not limited by the Example.

The vaporization supply device used in Example and Comparative Example was configured as shown in FIGS. 1 and 2. The control flow rate of the flow rate controller 4 was 20.0 g/min, the opening time (first predetermined time) per one time of the first control valve 11 was 22 seconds, the threshold pressure of the pressure detector 13 at the time of opening the first control valve 11 was 150 kPa (absolute pressure), and the inert gas FG to be sent to the liquid storage tank (reference symbol T in FIG. 6) was helium gas of 200 kPa (gauge pressure). The set temperature for heating the preheater was 180° C., the set temperature for heating the vaporizer was 200° C., the set temperature for heating the flow rate controller was 210° C. The liquid raw material was TEOS. TEOS has a saturated vapor pressure of 219 kPa·abs at 205° C.

With respect to the temperature control of the vaporizer, the Example switched the control-mode between M1, M2, and M3 in the time chart shown in FIG. 4. On the other hand, in the Comparative example, with respect to the temperature control of the vaporizer, the control mode was not switched, and the control was performed only in the first control mode M1 (PID control). In addition, each of the preheater and the flow rate controller was feedback controlled to be the respective set temperature.

Figure 5:
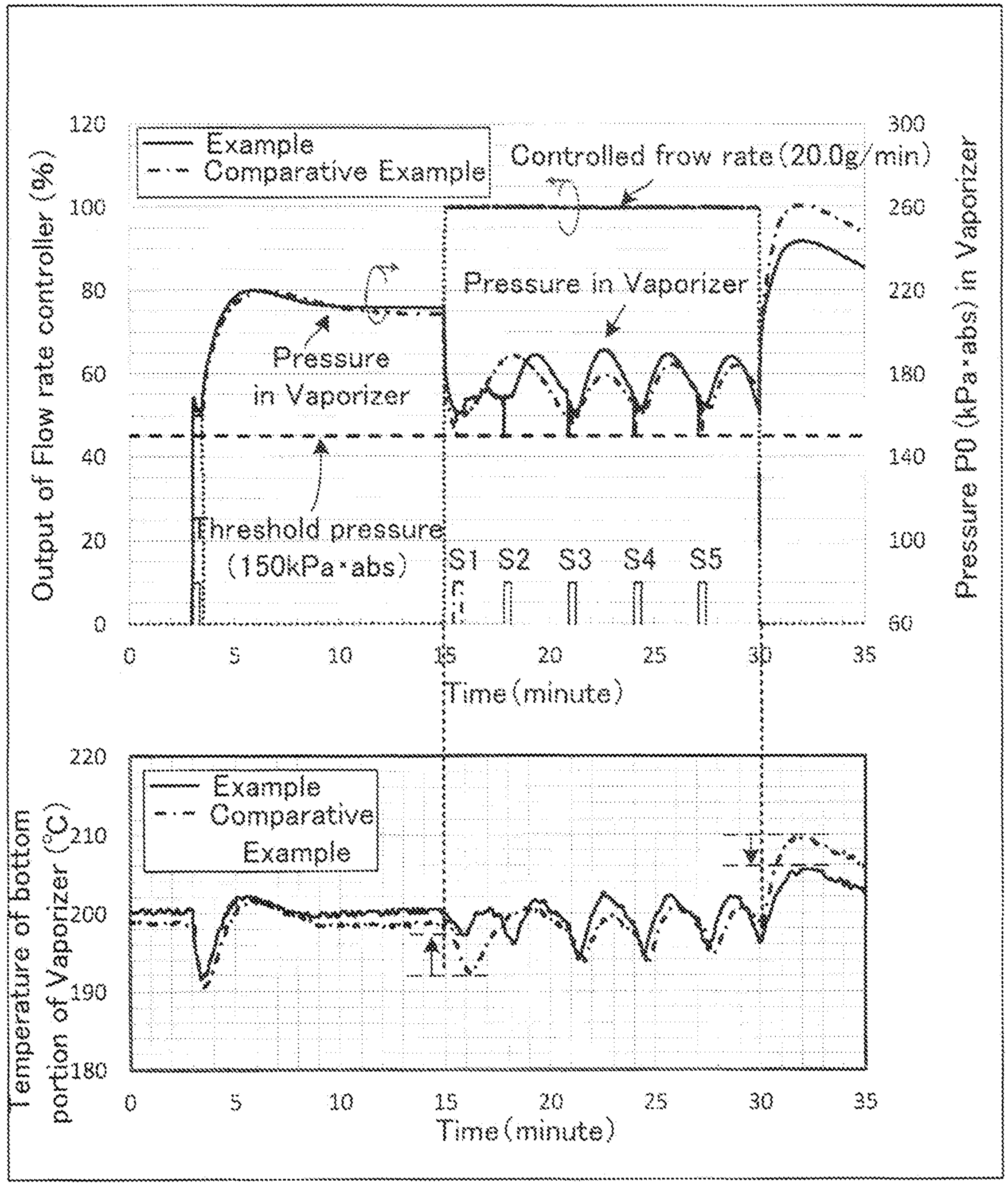
FIG. 5 is a graph showing pressure changes and temperature changes of an example of the vaporization supply device according to the present invention and a comparative example.

FIG. 5 is a time chart showing the pressure changes and temperature changes in the vaporizer of the Example and the Comparative Example. The upper time chart of FIG. 5 shows the pressure change in the vaporizer, the opening and closing timing of the first control valve 11, and the control flow rate (%) of the flow rate controller. The lower time chart of FIG. 5 shows the temperature change of the bottom surface of the vaporizer. In FIG. 5, S1 to S5 indicate the opening signal of the first control valve (11) and indicate the timing at which the liquid raw material is supplied to the vaporizer for a predetermined time. In the Comparative Example, the opening signal of the first control valve (11) was output at S1, S3, S4, and S5, and the liquid raw material was supplied into the vaporizer. In the Example, the opening signal of the first control valve was output at S2, S3, S4, and S5, and the liquid raw material was supplied into the vaporizer.

In the Example, as shown in FIG. 4, immediately after the flow rate control started, by controlling the temperature at the second predetermined time Δta in the second control mode M2, as can be seen from FIG. 5, the temperature in the vaporizer increased as compared with that in the Comparative Example, the vaporization amount of the gas in the vaporizer increased, and the pressure drop in the vaporizer was smaller than that in the Comparative Example. As a result, immediately after the flow rate control started (about 16 minutes in FIG. 5), the pressure has reached the pressure threshold value in the Comparative Example but has not reached the threshold value in the Example. Thereby, the Example prevented the liquid raw material from being supplied into the vaporizer by opening the first control valve 11, even though the liquid raw material still remained in the vaporizer immediately after the gas supply started.

Further, in the Example, as shown in FIG. 4, by controlling the fourth predetermined time Δtc from the third predetermined time Δtb before the gas supply ended in the third control mode M3, as can be seen in FIG. 5, the temperature rise after stopping the flow rate control (gas supply ended) is lower than that of the Comparative Example, and the Comparative Example has exceeded a predetermined reference temperature (in this Example 208° C.), but the Example has not exceed the reference temperature of 205.6° C. Therefore, the Example was able to prevent the temperature overshoot of the vaporizer when the gas supply ended.

The present invention is not limited to the above embodiments, and various aspects can be adopted without departing from the spirit of the present invention. For example, in the second control mode M2, rather than setting the duty ratio, the amount of heat supplied to the vaporizer may be increased by setting the set temperature to a value higher than the normal control temperature.

REFERENCE SIGNS LIST

1, 1A Vaporization supply device
2, 2A Vaporizer
2*a*3 Vaporization chamber
4 Flow rate controller
5 Controller
11 First control valve
13 Pressure detector
9A Temperature control unit
14 Liquid supply control unit

What is claimed is:

1. A vaporization supply device comprising:
a vaporizer for heating and vaporizing a liquid raw material;
a flow rate controller for controlling a flow rate of a gas supplied from the vaporizer to a gas supply destination; and
a controller for heating an inside of the vaporizer to obtain a necessary gas flow rate and performing feedback control so that a pressure becomes equal to or higher than a predetermined value, wherein
the controller is configured so as to stop the feedback control at a time point when the flow rate control by the flow rate controller starts, heat the liquid raw material by providing an amount of heat to the vaporizer more than the amount of heat that has already been provided until immediately before the feedback control ends, and change to the feedback control after a predetermined time has elapsed from the time point when the flow rate control by the flow rate controller starts.

2. The vaporization supply device according to claim 1, wherein the controller is configured so as to stop heating the vaporizer a predetermined time before the time point when the gas supply from the vaporizer ends, thereby vaporize the liquid in the vaporizer by the amount of heat that has already been given to the vaporizer until the time point when the gas supply from the vaporizer ends.

3. The vaporization supply device according to claim 1, wherein the flow rate controller is a pressure type flow rate controller.

4. A vaporization supply device according to claim 1, wherein a preheater for preheating the liquid raw material to be supplied to the vaporizer is connected to the vaporizer.

5. The vaporization supply device according to claim 1, wherein the controller controls the heater for heating the liquid raw material at a duty ratio of 100% until a predetermined time has elapsed from the time point when the flow rate control by the flow rate controller starts.

6. A vaporization supply method of a vaporizer of the vaporization supply device according to claim 1 for heating and vaporizing a liquid raw material inside the vaporizer, controlling a flow rate of a vaporized gas, and supplying the vaporized gas to a supply destination, by using the vaporizer, an inside of the vaporizer being heated to obtain a necessary gas flow rate, and feedback control being performed so that a pressure becomes equal to or higher than a predetermined value, the vaporization supply method comprising steps of:

stopping the feedback control at a time point when the flow rate control of the vaporized gas starts, and heating the liquid raw material in the vaporizer by providing a heat amount more than a heat amount that has already been provided immediately before stopping the feedback control, thereby increasing an evaporation amount of the vaporized gas more than that when the feedback control is performed;

and changing the amount of heat provided to the vaporizer to the amount of heat provided by the feedback control, after a predetermined time has elapsed from the time when the flow rate control of the vaporized gas starts.

7. The vaporization supply method of the vaporizer according to claim 6, further comprising a step of stopping to heat the liquid raw material a predetermined time before the time point when the gas supply from the vaporizer ends and vaporizing the liquid raw material in the vaporizer by the amount of heat that has already been provided to the vaporizer until the time point when the gas supply from the vaporizer ends.

8. The vaporization supply method of the vaporizer according to claim 6, wherein the gas in the vaporizer is flow-rate controlled by a pressure type flow rate control device and supplied to the supply destination.

9. The vaporization supply method of the vaporizer according to claim 6, further comprising a step of preheating the liquid raw material to be vaporized in the vaporizer.

10. The vaporization supply method of the vaporizer according to claim 6, wherein a heater for heating the liquid raw material is controlled at a duty ratio of 100% until a predetermined time has elapsed from the time when the flow rate control of the vaporized gas starts.

* * * * *